United States Patent
Hsin et al.

(10) Patent No.: US 8,314,481 B2
(45) Date of Patent: Nov. 20, 2012

(54) SUBSTRATE STRUCTURE FOR AN IMAGE SENSOR PACKAGE AND METHOD FOR MANUFACTURING THE SAME

(75) Inventors: Chung Hsien Hsin, Hsinchu Hsien (TW); Yves Huang, Hsinchu Hsien (TW); Kevin Chang, Hsinchu Hsien (TW); Chief Lin, Hsinchu Hsien (TW)

(73) Assignee: Kingpak Technology Inc., Hsinchu Hsien (TW)

( * ) Notice: Subject to any disclaimer, the term of this patent is extended or adjusted under 35 U.S.C. 154(b) by 1542 days.

(21) Appl. No.: 11/131,727

(22) Filed: May 18, 2005

(65) Prior Publication Data

US 2006/0275943 A1 Dec. 7, 2006

(51) Int. Cl.
  *H01L 23/06* (2006.01)
(52) U.S. Cl. .......... 257/684; 257/685; 257/723; 438/26; 438/64; 438/111; 438/118
(58) Field of Classification Search .......... 257/666, 257/685, 688, 723, 724, 737, 738, 686, 690, 257/734, 784, 780, 698, 678, 684, 704, 711, 257/713, 731, 732, 733, 778, 779, 781, 782, 257/783; 438/109, 113, 121, 125, 64, 26, 438/106, 108, 111, 118; 361/742, 758, 767
See application file for complete search history.

(56) References Cited

U.S. PATENT DOCUMENTS

| | | | |
|---|---|---|---|
| 2002/0058208 A1* | 5/2002 | Lin et al. | 430/311 |
| 2002/0185734 A1* | 12/2002 | Zhao et al. | 257/737 |
| 2003/0214029 A1* | 11/2003 | Tao et al. | 257/723 |
| 2005/0042838 A1* | 2/2005 | Garyainov et al. | 438/455 |
| 2005/0141396 A1* | 6/2005 | Hongo et al. | 369/121 |
| 2005/0157477 A1* | 7/2005 | Kuramochi et al. | 361/761 |
| 2005/0193548 A1* | 9/2005 | Nakazawa | 29/594 |
| 2006/0008939 A1* | 1/2006 | Chen et al. | 438/65 |

* cited by examiner

*Primary Examiner* — Long Tran
*Assistant Examiner* — Thanh Y Tran
(74) *Attorney, Agent, or Firm* — Stites & Harbison, PLLC; Juan Carlos A. Marquez, Esq.

(57) ABSTRACT

A substrate structure for an image sensor package includes a bottom base and a frame layer. The bottom base has an upper surface formed with a plurality of first electrodes, and a lower surface formed with a plurality of second electrodes. An insulation layer is coated between the first electrodes and in direct surface contact with the upper surface of the bottom base. A frame layer is arranged on and in direct surface contact with the first electrodes and the insulation layer to form a cavity together with the bottom base. The insulation layer is interposed between the bottom base and the frame layer.

6 Claims, 3 Drawing Sheets

SUBSTRATE STRUCTURE FOR AN IMAGE SENSOR PACKAGE AND METHOD FOR MANUFACTURING THE SAME

BACKGROUND OF THE INVENTION

1. Field of the Invention

The invention relates to a substrate structure for an image sensor package and a method for manufacturing the same, and more particularly to a substrate structure having a frame layer formed on the substrate of an image sensor to enhance the reliability of the image sensor.

2. Description of the Related Art

Referring to FIG. 1, an image sensor structure includes a substrate 10, a frame layer 18, a photosensitive chip 26, a plurality of wires 28, and a transparent layer 34.

The substrate 10 has a first surface 12 on which a plurality of first electrodes 15 are formed, and a second surface 14 on which a plurality of second electrodes 16 are formed. The first electrodes 15 are electrically connected to the corresponding second electrodes 16 by the conductive wires 17, which are located at the side of the substrate. The frame layer 18 has an upper surface 20 and a lower surface 22 adhered to the first surface 12 of the substrate 10 to form a cavity 24 together with the substrate 10. The photosensitive chip 26 is arranged within the cavity 24, and is mounted to the first surface 12 of the substrate 10. Each wire 28 has a first terminal 30 and a second terminal 32. The first terminals 30 are electrically connected to the photosensitive chip 26, and the second terminals 32 are electrically connected to the first electrodes 15 of the substrate 10. The transparent layer 34 is adhered to the upper surface 20 of the frame layer 18.

Therefore, in the process of manufacturing the substrate 10 and the frame layer 18, particles and wet air from atmosphere will enter the product through passages between the first electrodes, so the reliability of the product may be reduced.

SUMMARY OF THE INVENTION

An objective of the invention is to provide a substrate structure for an image sensor package and a method for manufacturing the same capable of increasing the reliability of the image sensor package.

To achieve the above-mentioned object, the invention provides a substrate structure, which includes a bottom base and a frame layer. The bottom base has an upper surface formed with a plurality of first electrodes, and a lower surface formed with a plurality of second electrodes, wherein an insulation layer is coated between the first electrodes and in direct surface contact with the upper surface of the bottom base. The frame layer is arranged on and in direct surface contact with the first electrodes and the insulation layer to form a cavity together with the bottom base. The insulation layer is interposed between the bottom base and the frame layer.

DETAILED DESCRIPTION OF THE INVENTION

Figure 1:
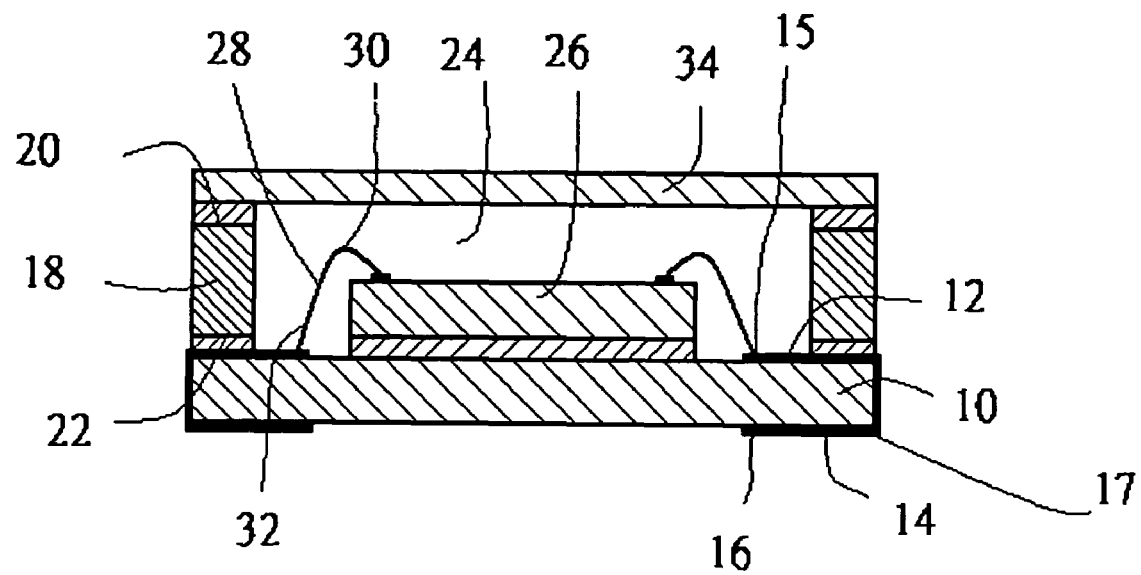
FIG. 1 is a schematic illustration showing an image sensor structure according to the prior art.
Figure 2:
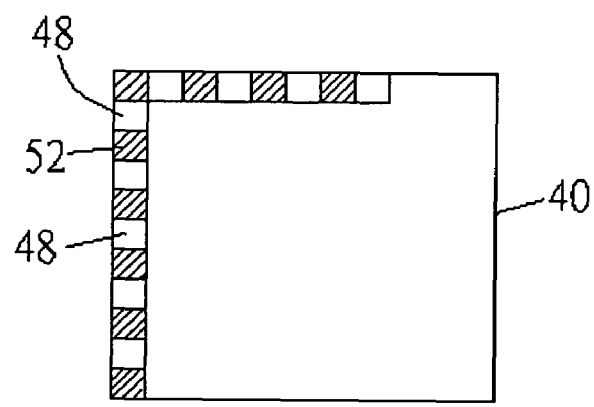
FIG. 2 is a top view showing a bottom base of a substrate structure for an image sensor package according to the invention.
Figure 3:
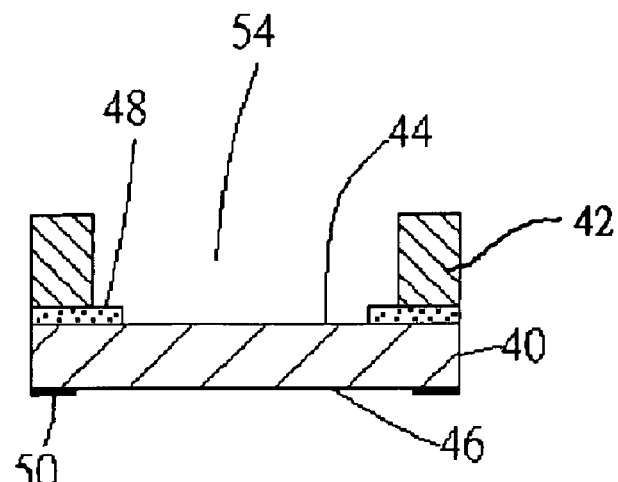
FIG. 3 is a cross-sectional view showing the substrate structure for the image sensor package.

Please refer to FIGS. 2 and 3, a substrate structure for an image sensor package of the present invention includes a bottom base 40 and a frame layer 42.

The bottom base 40 has an upper surface 44 formed with a plurality of first electrodes 48, and a lower surface 46 formed with a plurality of second electrodes 50. Each of the first electrodes 48 is electrically connected to the corresponding second electrode 50. An insulation layer 52 is coated between the first electrodes 48 and in direct surface contact with the upper surface 44 of the bottom base 40 so as to smooth the first electrodes 48 on the upper surface 44 of the bottom base 40. The insulation layer 52 is interposed between the bottom base 40 and the frame layer 42. In the embodiment, the insulation layer 52 is composed of green paint coated between the first electrodes 48.

The frame layer 42 is arranged on and in direct surface contact with the first electrodes 48 and the insulation layer 52 to form a cavity 54 together with the bottom base 40.

Figure 4:
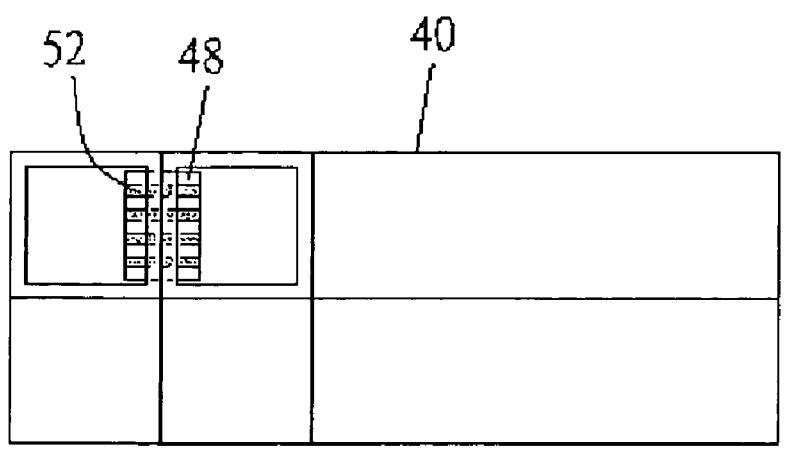
FIG. 4 is a first schematic illustration showing a method for manufacturing a substrate structure.
Figure 5:
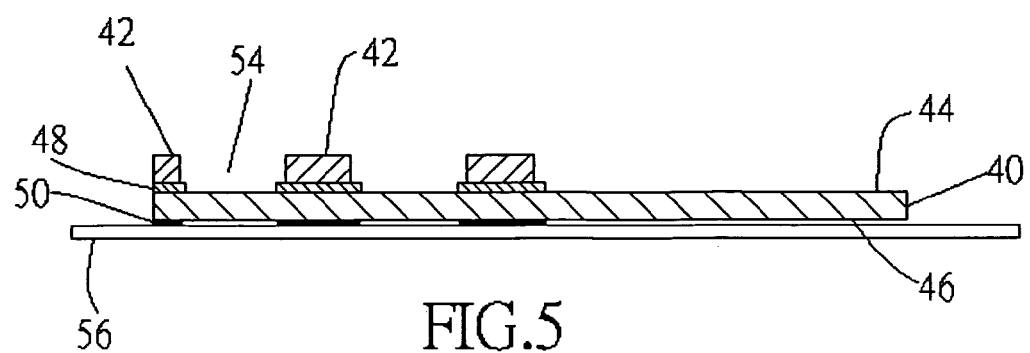
FIG. 5 is a second schematic illustration showing a method for manufacturing the substrate structure.

Please refer to FIGS. 2 to 4, a method for manufacturing substrate structures of image sensor packages, includes the following steps, First, a bottom base 40 having an upper surface 44 formed with a plurality of first electrodes 48 is provided. Each of the first electrodes 48 is electrically connected to the corresponding second electrode 50. An insulation layer 52 is then coated between the first electrodes 48 and in direct surface contact with the upper surface 44 of the bottom base 40 so as to smooth the first electrodes 48 on the upper surface 44 of the bottom base 40. In the embodiment, the insulation layer 52 is composed of green paint coated between the first electrodes 48.

Next, a frame layer 42 is arranged on and in direct surface contact with the upper surface 44 of the bottom base 40 to form a plurality of cavities 54 together with the bottom base 40.

Then, a glue film 56 is fixed onto the lower surface 46 of the bottom base 40.

The last step is to cut from the frame layer 42 to the glue film 56 to form the substrate structures.

While the invention has been described by the way of an example and in terms of a preferred embodiment, it is to be understood that the invention is not limited to the disclosed embodiment. On the contrary, it is intended to cover various modifications. Therefore, the scope of the appended claims should be accorded the broadest interpretation so as to encompass all such modifications.

What is claimed is:

1. A substrate structure for an image sensor package, the substrate structure comprising:
a bottom base having an upper surface formed with a plurality of first electrodes, and a lower surface formed with a plurality of second electrodes, wherein an insulation layer is coated between first electrodes and in direct surface contact with the upper surface of the bottom base;
a frame layer arranged on and in direct surface contact with the first electrodes and the insulation layer to form a cavity together with the bottom base, wherein the insulation layer is interposed between the bottom base and the frame layer.

2. The substrate structure according to claim 1, wherein the first electrodes are electrically connected to the second electrodes, respectively.

3. The substrate structure according to claim 1, wherein the insulation layer is composed of green paint.

4. A method for manufacturing substrate structures of image sensor packages, the method comprising:
- providing a bottom base having an upper surface formed with a plurality of first electrodes;
- coating an insulation layer between the first electrodes and in direct surface contact with the upper surface of the bottom base;
- arranging a frame layer on and in direct surface contact with the first electrodes and the insulation layer to form a plurality of cavities together with the bottom base, wherein the insulation layer is interposed between the bottom base and the frame layer;
- fixing a glue film onto a lower surface of the bottom base; and
- cutting from the frame layer to the glue film to form the substrate structures.

5. The method according to claim 4, wherein the first electrodes are electrically connected to second electrodes formed on the lower surface of the bottom base, respectively.

6. The method according to claim 4, wherein the insulation layer is composed of green paint.

* * * * *